(12) United States Patent
Yang et al.

(10) Patent No.: US 10,741,759 B2
(45) Date of Patent: Aug. 11, 2020

(54) DIFFUSIVE MEMRISTOR AND DEVICE FOR SYNAPTIC EMULATOR

(71) Applicant: University of Massachusetts, Boston, MA (US)

(72) Inventors: Jianhua Yang, Hadley, MA (US); Qiangfei Xia, Amherst, MA (US); Mark McLean, Severna Park, MD (US); Qing Wu, Manilus, NY (US); Mark Barnell, Clay, NY (US)

(73) Assignee: University of Massachusetts, Boston, MA (US)

( * ) Notice: Subject to any disclaimer, the term of this patent is extended or adjusted under 35 U.S.C. 154(b) by 0 days.

(21) Appl. No.: 16/142,310

(22) Filed: Sep. 26, 2018

(65) Prior Publication Data

US 2020/0227635 A1 Jul. 16, 2020

Related U.S. Application Data

(60) Provisional application No. 62/563,620, filed on Sep. 26, 2017.

(51) Int. Cl.
*H01L 45/00* (2006.01)

(52) U.S. Cl.
CPC ........ *H01L 45/1266* (2013.01); *H01L 45/085* (2013.01); *H01L 45/1233* (2013.01);
(Continued)

(58) Field of Classification Search
CPC ............... H01L 45/1266; H01L 45/146; H01L 45/1253; H01L 45/145; H01L 45/1233; H01L 45/085
See application file for complete search history.

(56) References Cited

U.S. PATENT DOCUMENTS

2019/0303104 A1* 10/2019 Yang ................... H01L 45/1266

OTHER PUBLICATIONS

Wang et al. "Memristor with diffusive dynamics as synaotic emulators for neuromorphic computing," nature material vol. 16, Jan. 2017, online Sep. 26, 2016. (Year: 2016).*

(Continued)

*Primary Examiner* — Matthew L Reames
(74) *Attorney, Agent, or Firm* — Fish & Richardson P.C.

(57) ABSTRACT

A diffusive memristor device and an electronic device for emulating a biological synapse are disclosed. The diffusive memristor device includes a bottom electrode, a top electrode formed opposite the bottom electrode, and a dielectric layer disposed between the top electrode and the bottom electrode. The dielectric layer comprises silver doped silicon oxynitride ($SiO_xN_y$:Ag). In an alternate implementation, the dielectric layer comprises silver doped silicon oxide (Ag:$SiO_2$). An electronic synapse emulation device is also disclosed. The synapse emulation device includes a diffusive memristor device, a drift memristor device connected in series with the diffusive memristor device, a first voltage pulse generator connected to the diffusive memristor device, and a second voltage pulse generator connected to the drift memristor device. Application of a signal from one of the first voltage pulse generator or the second voltage pulse generator allows the synapse emulation device to exhibit long-term plasticity.

22 Claims, 9 Drawing Sheets

(52) U.S. Cl.
CPC ........ *H01L 45/1253* (2013.01); *H01L 45/145* (2013.01); *H01L 45/146* (2013.01)

(56) References Cited

OTHER PUBLICATIONS

Wang et al. "Memristor with diffusive dynamics as synaotic emulators for neuromorphic computing," Brookhaven National Lab. Preprint dated Aug. 2016 (Year: 2016).*

* cited by examiner

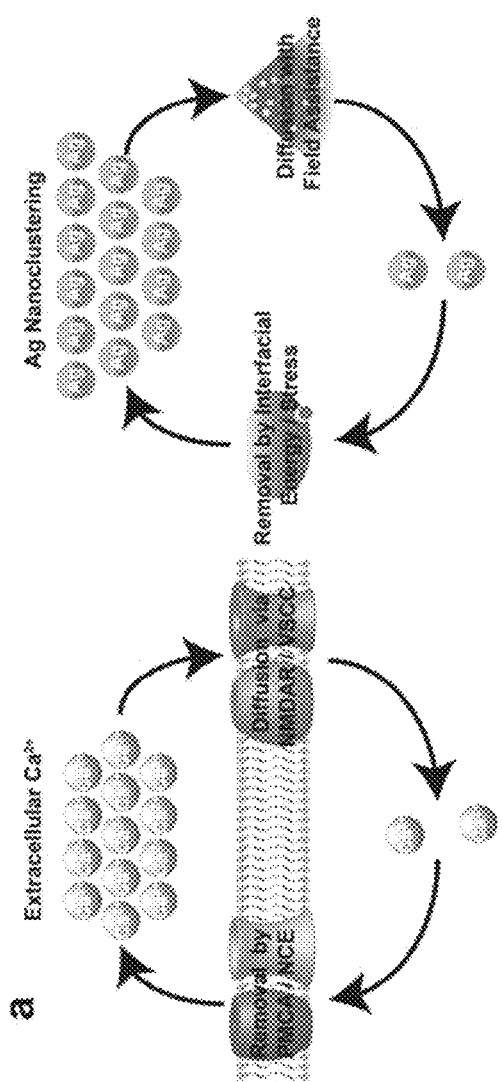
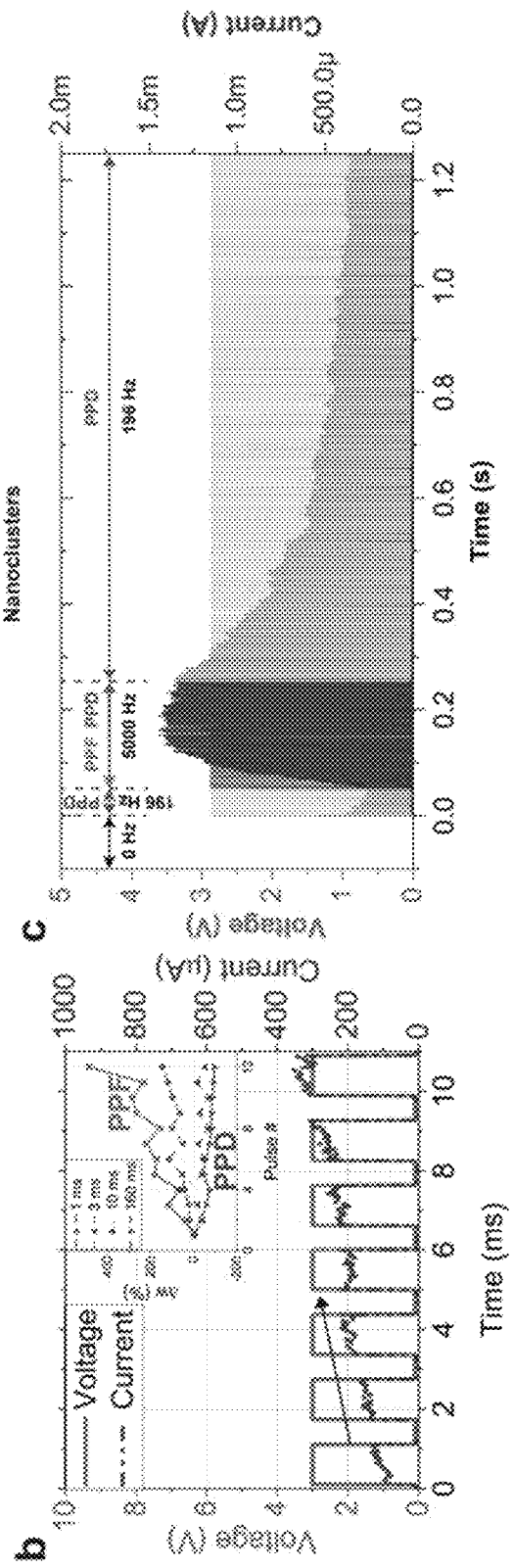
FIGS. 5a – 5c

DIFFUSIVE MEMRISTOR AND DEVICE FOR SYNAPTIC EMULATOR

CLAIM OF PRIORITY

This application claims priority under 35 USC § 119(e) to U.S. Patent Application Ser. No. 62/563,620, filed on Sep. 26, 2017, the entire contents of which are hereby incorporated by reference.

GOVERNMENT FUNDING

This invention was made with government support under Grant No. FA8750-15-2-0044 awarded by the U.S. Air Force Research Laboratory (AFRL), with government support under Contract No. 2014-14080800008 awarded by the Intelligence Advance Research Projects Activity (IARPA), with government support under Grant No. FA9550-12-1-0038 by the U.S. Air Force Office for Scientific Research (AFOSR), and with government support under ECCS-1253073 awarded by the National Science Foundation (NSF). The government has certain rights in the invention.

TECHNICAL FIELD

This application relates to diffusive memristors and devices using diffusive memristors to emulate a biological synapse.

BACKGROUND

Complementary metal-oxide-semiconductor (CMOS) circuits have been employed to mimic synaptic $Ca^{2+}$ dynamics, but three-terminal devices bear limited resemblance to bio-counterparts at the mechanism level and require significant numbers and complex circuits to simulate synaptic behavior. A substantial reduction in footprint, complexity and energy consumption can be achieved by building a two-terminal circuit element, such as a memristor directly incorporating $Ca^{2+}$-like dynamics. Various types of memristors based on ionic drift (drift-type memristor) have recently been utilized for this purpose in neuromorphic architectures. Although qualitative synaptic functionality has been demonstrated, the fast switching and non-volatility of drift memristors optimized for memory applications do not faithfully replicate the nature of plasticity. Similar issues also exist in metal-oxide-semiconductor-based (MOS-based) memristor emulators, although they are capable of simulating a variety of synaptic functions including spike-timing-dependent plasticity (STDP). Recently, researchers and previous implementations adopted second-order drift memristors to approximate the $Ca^{2+}$ dynamics of chemical synapses in biological structures by utilizing thermal dissipation or mobility decay, which successfully demonstrated STDP with non-overlapping spikes and other synaptic functions. This previous approach features repeatability and simplicity, but the significant differences of the physical processes from actual synapses limit the fidelity and variety of desired synaptic functions. A device with similar physical behavior to the biological $Ca^{2+}$ dynamics would enable improved emulation of synaptic function and broad applications to neuromorphic computing.

SUMMARY

Described herein are diffusive memristors that are operable to emulate biological synaptic functions. The diffusive memristors are based on metal atom diffusion and spontaneous nanoparticle formation, as determined by in situ high-resolution transmission electron microscopy (HRTEM) and nanoparticle dynamics simulations. The dynamical properties of the diffusive memristors described herein are analogous to and therefore allow implementation of an electronic circuit operable to emulate $Ca^{2+}$ in bio-synapses. The operating characteristics of these diffusive memristors were experimentally verified by demonstrating both short- and long-term plasticity, including synaptic functions that have not been unambiguously demonstrated previously.

In biological synapses, the accumulation and extrusion of $Ca^{2+}$ in the pre- and postsynaptic compartments play a critical role in initiating plastic changes. To emulate this fundamental biological process in electronic devices, multiple diffusive Ag-in-oxide (silver-doped oxide) memristors having a temporal response during and after stimulation similar to that of the synaptic $Ca^{2+}$ dynamics are described. In situ high-resolution transmission electron microscopy (HRTEM) and nanoparticle dynamics simulations both demonstrate that Ag atoms disperse under electrical bias and regroup spontaneously under zero bias because of interfacial energy minimization, closely resembling synaptic influx and extrusion of $Ca^{2+}$, respectively. These diffusive memristors and their dynamics enable a direct emulation of both short- and long-term plasticity of biological synapses, representing an advance in hardware implementation of neuromorphic functionalities.

According to one innovative aspect of the subject matter described in this application, a diffusive memristor includes a bottom electrode, a top electrode formed opposite the bottom electrode, and a dielectric layer disposed between the top electrode and the bottom electrode, wherein the dielectric layer comprises silver doped silicon oxynitride ($SiO_xN_y$:Ag).

The diffusive memristor may include one or more of the following optional features. The bottom electrode may include one of a platinum layer or a gold layer. The top electrode may include one of a platinum layer or a gold layer. The dielectric layer may include silver nanoparticles disposed within the silicon oxynitride. The diffusive memristor may be formed on a substrate.

According to another innovative aspect of the subject matter described in this application, a synapse emulation device includes a diffusive memristor device, and a drift memristor device connected in series with the diffusive memristor device. A first voltage pulse generator is connected to the diffusive memristor device, and a second voltage pulse generator is connected to the drift memristor device. The diffusive memristor device exhibits long-term plasticity upon application of a signal from one of the first voltage pulse generator or the second voltage pulse generator to the synapse emulation device.

The synapse emulation device may include one or more of the following optional features. A long low-voltage pulse may turn the diffusive memristor device on. A short high-voltage pulse may switch the drift memristor device. The diffusive memristor device may be a silver doped silicon oxynitride ($SiO_xN_y$:Ag) based diffusive memristor. The drift memristor device may be a tantalum oxide ($TaO_x$) based drift memristor.

According to another innovative aspect of the subject matter described in this application, a diffusive memristor device includes a bottom metal electrode, a top metal electrode formed opposite the bottom metal electrode, and a dielectric layer disposed between the top metal electrode and the bottom metal electrode, wherein the dielectric layer comprises a combination of (i) a diffusive metal and (ii) one of an oxide, an oxynitride, or a nitride. Nanoclusters of the diffusive metal are formed within the dielectric layer.

The diffusive memristor device may include one or more of the following optional features. The bottom electrode may include one of a platinum layer or a gold layer. The top electrode may include one of a platinum layer or a gold layer. The diffusive metal may include one of silver or copper. The oxide may include silicon oxide ($SiO_2$). The oxynitride may include silicon oxynitride ($SiN_yO_x$). The diffusive memristor may be formed on a substrate.

The details of one or more implementations of the subject matter described in this specification are set forth in the accompanying drawings and the description below. A particular advantage of the diffusive memristor is that its physical properties provide a device with highly nonlinear, fast and repeatable threshold switching behaviors. Another advantage of the diffusive memristor is that it may be combined with a suitable drift memristor to implement an electronic synapse emulation device that emulates biological synaptic functions. Other features, aspects, and advantages of the subject matter will become apparent from the description, the drawings, and the claims.

BRIEF DESCRIPTION OF THE DRAWINGS

FIGS. 5a-5c illustrate the analogy between $Ca^{2+}$ and Ag dynamics, and short-term synaptic plasticity of a diffusive memristor device.

DETAILED DESCRIPTION

Figures 1A, 1B, 1C, 1D:
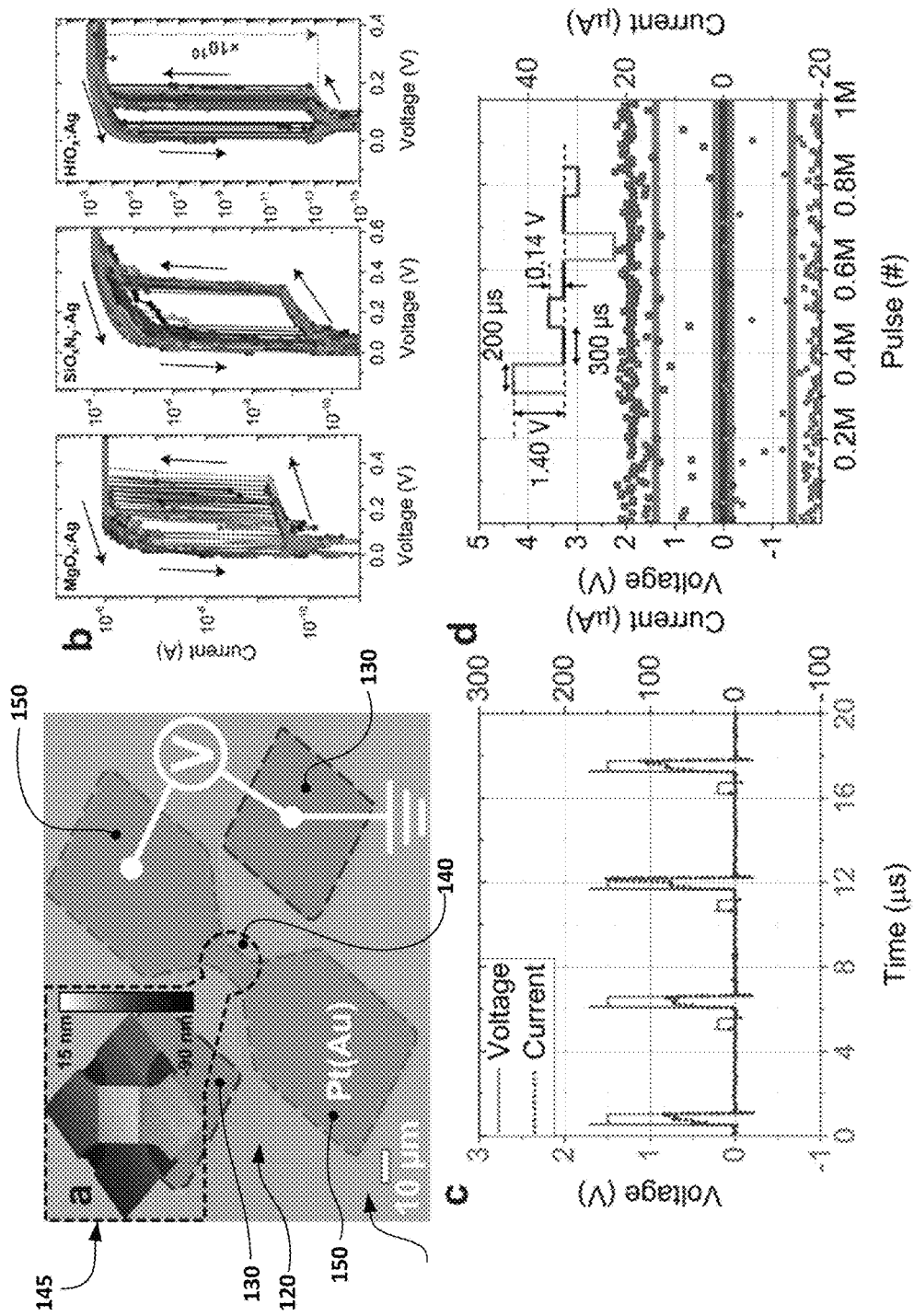
FIG. 1a-1f illustrate a schematic diagram of an example of a diffusive memristor and its switching behavior.

FIGS. 1a-1f illustrate a schematic diagram of an example of a diffusive memristor device 120 and its switching behavior. As shown in FIG. 1a, the diffusive memristor 120 includes two platinum (Pt) or gold (Au) inert electrodes, such as bottom electrode 130 and top electrode 150, sandwiching a switching layer of a dielectric film 140 with embedded silver (Ag) nanoclusters 142 (shown in FIG. 1e; see also example processes or methods described below). In some implementations, the Ag nanoclusters are metallic, which can be seen, e.g., using X-ray photoelectron spectroscopy, and further confirmed by high resolution transmission electron microscopy (HRTEM) micrographs showing Ag nanocrystals in the silver doped silicon oxynitride, and represented as $SiO_xN_y$:Ag.

The diffusive memristor device 120 is similar to electrochemical metallization memory (ECM) cells in terms of utilizing mobile species of noble metals, but is distinct in terms of the structural and electrical biasing symmetry, metal concentration and profile, and transient switching behavior. FIG. 1b shows a graphical representation of a voltage applied to the diffusive memristor device 120. When the applied voltage is above a threshold, the voltage abruptly switches the diffusive memristor device 120 to a conductance state, which is limited by an external compliance current. To demonstrate that the device spontaneously relaxes back to an insulating configuration upon removing the electrical bias voltage (without applying an opposite polarity voltage), repeatable current-voltage (I-V) loops with only positive applied voltages were used in collecting the data in FIG. 1b. The threshold switching is unipolar in nature and significantly different from non-volatile drift-type memristors, especially in the OFF-switching process, which can be seen, for example, by symmetric hysteresis loops with opposite polarity bias.

In some implementations, the diffusive memristor device 120 represented by FIG. 1a has an area of 10 µm×10 µm (in micro-device size) or an area of 100 nm×100 nm (in nano-device size), which exhibit similar switching behaviors. The resistance ratio between the conducting and insulating states is five orders of magnitude in the $SiO_xN_y$:Ag diffusive memristor, and over ten orders in the $HfO_x$:Ag diffusive memristor, the highest reported in threshold switching devices so far. The volatile switching has sharp turn-on slopes of, e.g., approximately 10 mV $decade^{-1}$ in $MgO_x$:Ag and $SiO_xN_y$:Ag, and approximately ~1 mV $decade^{-1}$ in $HfO_x$:Ag. The high current capability and large resistance ratio enable diffusive memristors, such as diffusive memristor 120, to be utilized as selectors for mitigating sneak current paths in crossbar arrays. As shown by the example of FIG. 1c, each 500 ns/1.5 V switching pulse is followed by a 500 ns/0.2 V reading pulse to verify that the device has relaxed back to the insulating state under zero bias within 5 µs after switching to the high-conductance state. FIG. 1d shows repeatable and symmetric switching using wider bipolar voltage pulses with over a million switching cycles. As shown in FIGS. 1b-1d, in some implementations, the diffusive memristor device 120 exhibits highly nonlinear, fast and repeatable switching behavior.

FIG. 1a shows a pseudo-color scanning electron micrograph of an example of a diffusive memristor device 120 that is configured as a crossbar device, while FIGS. 1b to 1d illustrate highly nonlinear, fast and repeatable threshold switching behavior of diffusive memristors. The top electrodes 150 of the diffusive memristor device 120 in FIG. 1a are depicted by the red dashed line and bottom electrodes 130 are depicted by the blue dashed lines. Electrical biasing is applied to the top electrode 150, with the bottom electrode 130 grounded. The inset shows an atomic force micrograph of the junction 145. FIG. 1b shows three graphs that depict repeatable highly nonlinear threshold switching I-V loops for devices with different host lattices doped with silver. FIG. 1c shows the high-speed switching characteristics of a $SiO_xN_y$:Ag based diffusive memristor device 120 at an elevated temperature of 600 K. The programming pulse width is 500 ns and the voltage is 1.5 V. FIG. 1d shows the endurance-cycling performance test of the $SiO_xN_y$:Ag based memristor device 120 for 1 million cycles at room temperature. The inset shows the shape of the applied voltage pulse, which consists of four segments: a 1.4 V/200 µs programming voltage and a 0.14 V/200 µs read voltage, followed by a −1.4 V/200 µs programming voltage and a −0.14 V/200 µs read voltage. In an experimental evaluation, one voltage and one current data point was sampled from each of the four segments of the pulse. The voltage samples are shown in red in FIG. 1d, while the purple dots and green dots correspond to device current due to positive and negative programming pulses, respectively. The read current for both positive and negative programming is at the instrument noise level (<100 nA) for the current measurement range used. The diffusive memristor device 120 did not fail during the measurement, demonstrating high robustness.

Figure 1E:
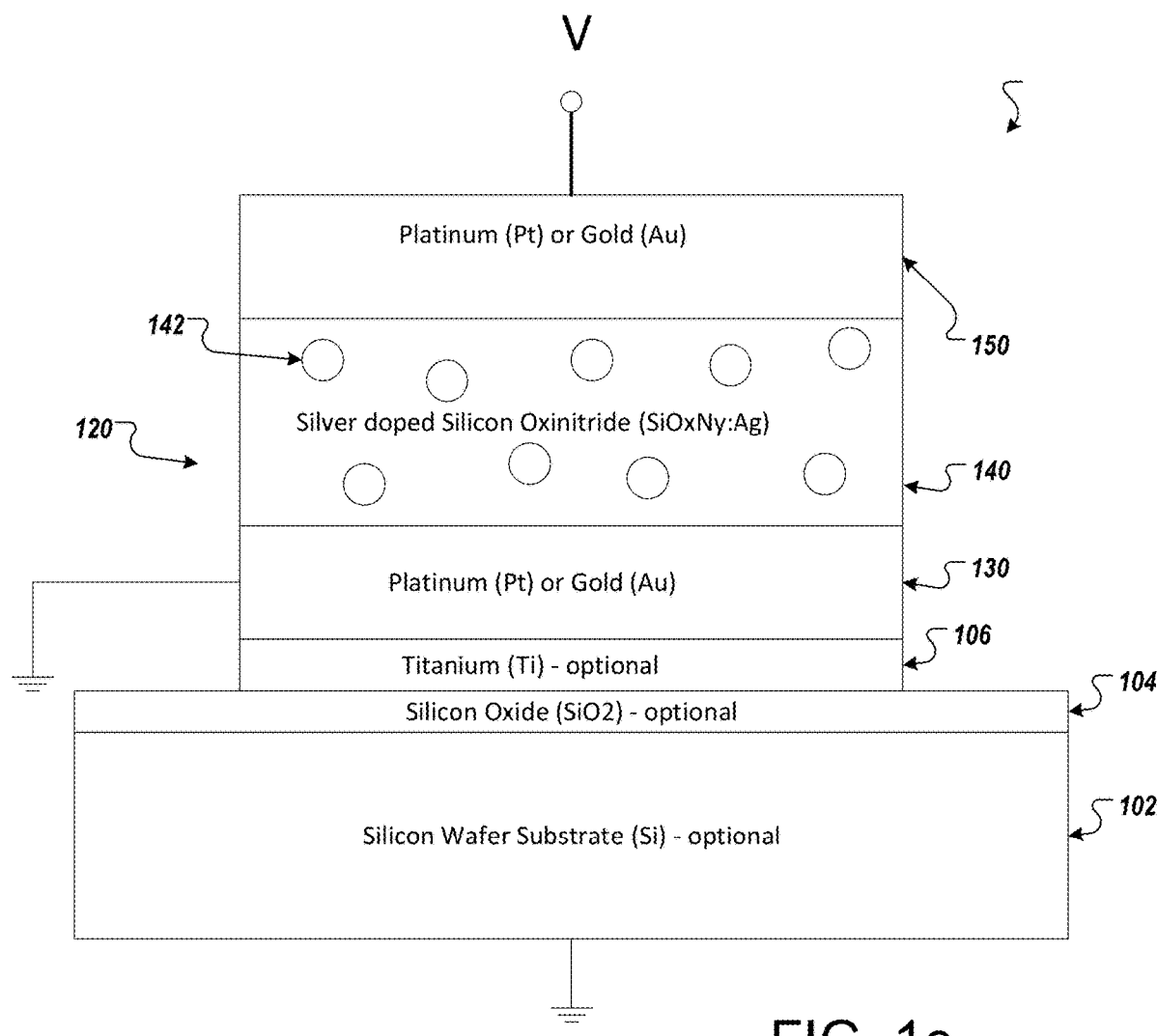

FIG. 1e illustrates a schematic diagram showing a cross-sectional view of an example crossbar circuit device forming the $SiO_xN_y$:Ag based diffusive memristor 120. It should be noted that the schematic representation showing the various layers of the diffusive memristor device 120 is not drawn to scale. The example structure in FIG. 1e shows the diffusive memristor 120 (optionally) fabricated on a semiconductor substrate 102, which, in some implementations, is a silicon (Si) wafer. An oxide layer, such as silicon oxide layer 104, may optionally be formed on the substrate 102. The circuit device may optionally include a thin titanium layer 106 deposited on the surface of the silicon oxide layer 104 to create an adhesion surface for the bottom electrode 130. The diffusive memristor device 120 includes a platinum (Pt) or gold (Au) layer that creates a bottom electrode 130, a silver doped silicon oxynitride ($SiO_xN_y$:Ag) layer that creates a dielectric insulating layer 140, and a platinum (Pt) or gold (Au) layer that creates a top electrode 150. The dielectric insulating layer 140 is shown to include silver nanoclusters 142. It should be noted that the diffusive memristor device 120 can be formed on substrates other than a silicon wafer based semiconductor substrate 102.

In the implementation shown in FIG. 1e, the platinum or gold layer forming the bottom electrode 130 is fabricated to a thickness of approximately 20 nm, the silver doped silicon oxynitride ($SiO_xN_y$:Ag) layer that creates the dielectric insulating layer 140 is fabricated to a thickness of approximately 15 nm, and the platinum or gold layer forming the top electrode 150 is fabricated to a thickness of approximately 30 nm. The optional thin titanium layer 106 is fabricated to a thickness of approximately 1.5 nm. Variations on the thickness of each layer are also within the scope of the present invention.

Figure 1F:
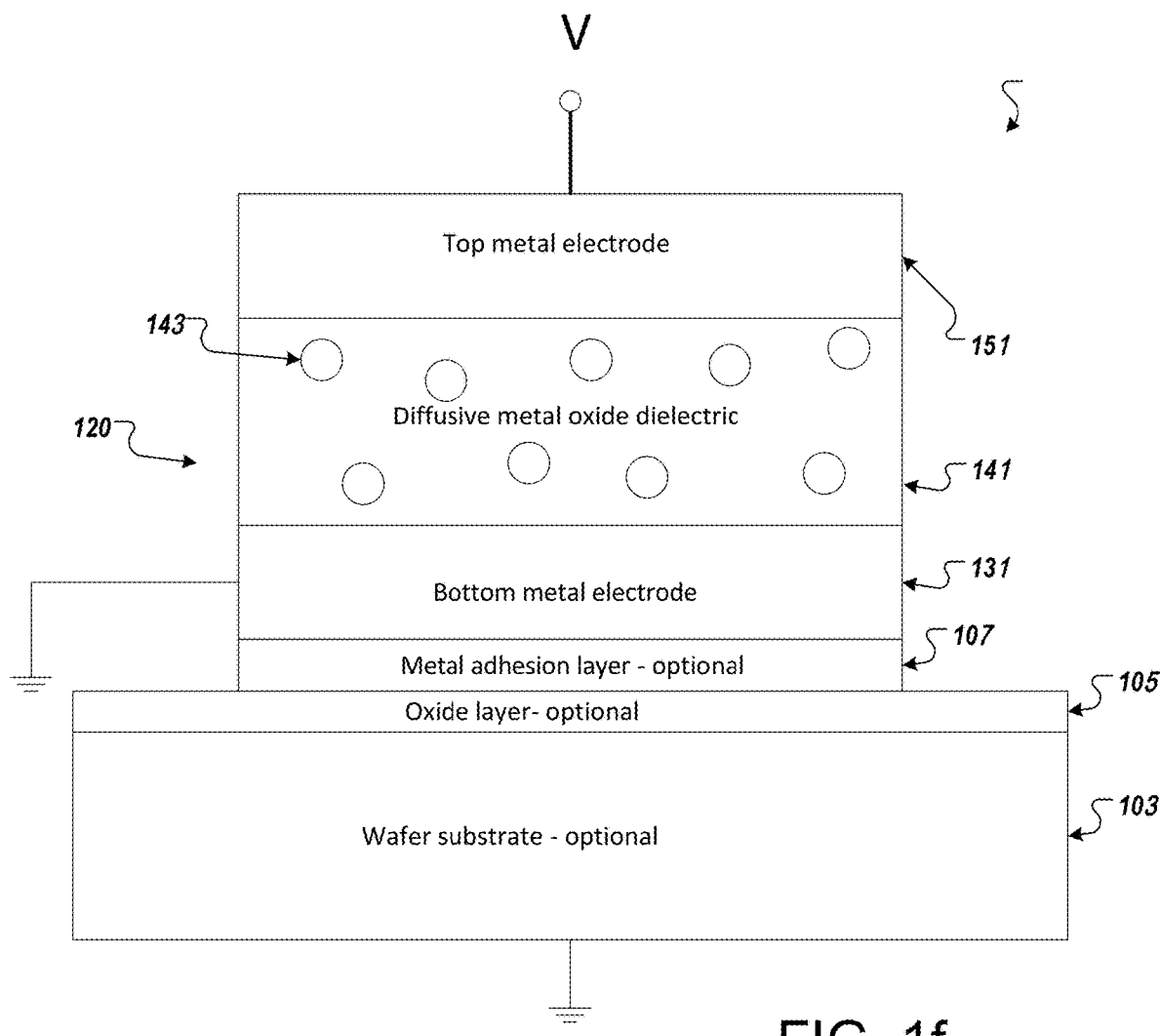

The diffusive memristor 120 can be fabricated from a different combination of materials in different implementations. FIG. 1f shows a general implementation of the diffusive memristor device 120, illustrating a schematic diagram showing a cross-sectional view of an example crossbar circuit device forming a diffusive metal oxide dielectric based diffusive memristor 120. It should be noted that the schematic representation showing the various layers of the diffusive memristor device 120 is not drawn to scale. The example structure in FIG. 1f shows the diffusive memristor 120 is (optionally) fabricated on a semiconductor substrate 103 which, in some implementations, may be a silicon (Si) wafer. It should be noted that the diffusive memristor device 120 can be formed on substrates 103 other than a silicon wafer based semiconductor substrate.

An oxide layer 105, such as a silicon oxide layer, may optionally be formed on the substrate 103. The circuit device may optionally include a thin metal adhesion layer 107 deposited on the surface of the oxide layer 105 to create an adhesion surface for the bottom metal electrode 131. In some implementations, the metal adhesion layer includes titanium (Ti), or some other suitable metal.

The diffusive memristor device 120 shown in FIG. 1f includes a first metal layer that creates a bottom electrode 131. In some implementations, the metal bottom electrode layer is formed of titanium (Ti), gold (Au), or platinum (Pt), or some other suitable metal.

The diffusive memristor device 120 shown in FIG. 1f also includes a diffusive metal oxide layer that creates a dielectric insulating layer 141. In some implementations, a silver doped silicon oxide (Ag:SiO2) is used as the diffusive metal oxide in the dielectric insulating layer 141. In some implementations, other fast diffusive metals, e.g., copper (Cu) is used in place of silver (Ag). In some implementations, silicon oxynitride (SiNyOx) is used in place of silicon oxide (SiO2). Other suitable combinations of a fast diffusive metal and silicon oxide or silicon oxynitiride can also be used for the dielectric insulating layer 141. The dielectric insulating layer 141 is shown to include diffusive metal nanoclusters 143, e.g., silver nanoclusters in implementations where a silver doped silicon oxide (Ag:SiO2) is used as the diffusive metal oxide in the dielectric insulating layer 141.

The diffusive memristor device 120 shown in FIG. 1f further includes a second metal layer that creates a top electrode 151. In some implementations, the second metal layer forming the top electrode 151 includes gold (Au), although other suitable metals can also be used.

In the implementation shown in FIG. 1f, the metal layer forming the bottom electrode 131 is fabricated to a thickness of approximately 15 nm, the diffusive metal oxide layer that creates the dielectric insulating layer 141 is fabricated to a thickness of approximately 10 nm, and the metal layer forming the top electrode 151 is fabricated to a thickness of approximately 40 nm. The optional thin metal adhesion layer 107 is fabricated to a thickness of approximately 1.5 nm. Variations on the thickness of each layer are also within the scope of the present invention.

Figure 2A:
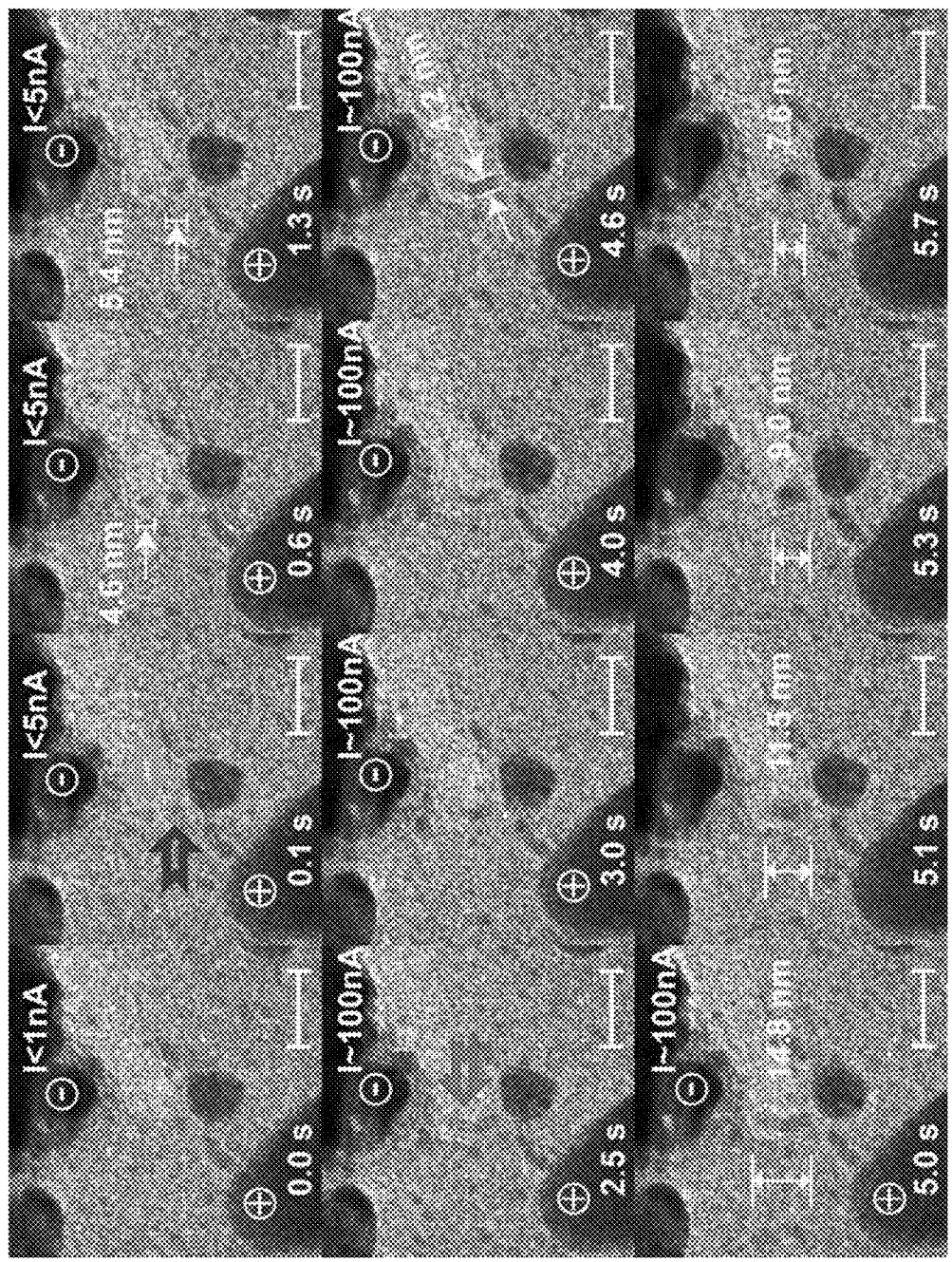
FIG. 2a illustrates a time based sequence of HRTEM images taken of a planar diffusive memristor device.

FIG. 2 shows a time based sequence of HRTEM images taken of a planar Au/$SiO_xN_y$:Ag/Au diffusive memristor device 120 with a nano-junction. The sequence of images from 0.0 s to 5.7 s in FIG. 2 shows an in situ transmission electron microscopy (TEM) observation of the threshold switching process, demonstrating that relaxation is a diffusion process driven by interfacial energy minimization. An external electric field is exerted at the point of time zero. Ag migration is observed at time 0.1 s, when two nanocrystals (orange and blue arrows in the image taken at 0.1 s) start to form. A clear arc-shaped filament is visible in the image taken at 2.5 s (red arrow). When the external biasing is removed at 5.0 s, the filament starts to deform, shrinking to a round spherical nanocluster, implying an interfacial energy driven diffusion mechanism. All scale bars in the images represent a distance of 20 nm.

Figures 2B, 2C, 2D:
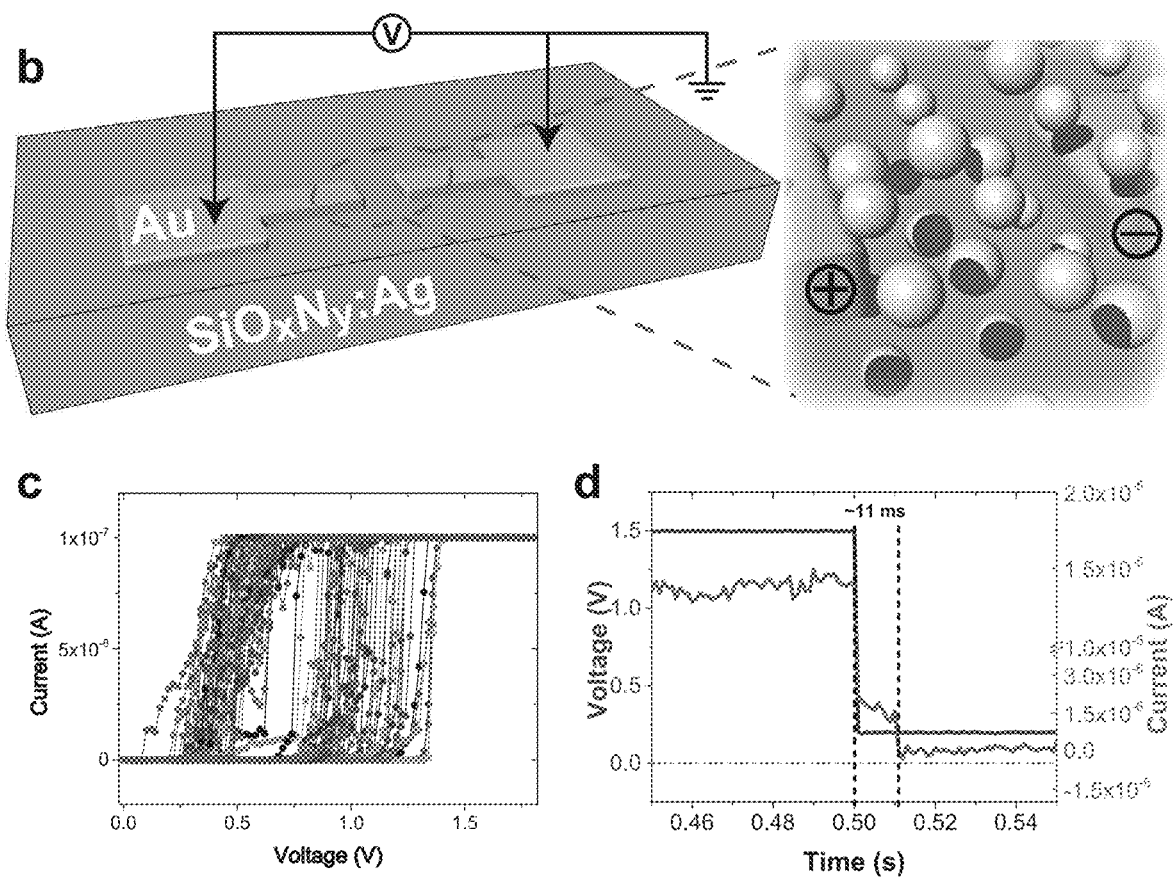
FIGS. 2b-2d illustrate an example Au/$SiO_xN_y$:Ag/Au lateral diffusive memristor device and corresponding electrical characteristics of the Au/$SiO_xN_y$:Ag/Au lateral diffusive memristor device.

The switching mechanism, e.g., the spontaneous relaxation to the insulating state on ceasing power, can be seen in some implementations using a planar Au/$SiO_x$ $N_y$:Ag/Au device similar to diffusive memristor 120 with a nano-junction, which is fabricated for in situ HRTEM characterizations. FIG. 2b illustrates an example Au/$SiO_xN_y$:Ag/Au lateral diffusive memristor device, while FIGS. 2c and 2d illustrate corresponding electrical characteristics of the Au/$SiO_xN_y$:Ag/Au lateral diffusive memristor device. As shown in FIGS. 2b and 2c, reliable threshold switching can be observed under a 100 nA compliance in ambient conditions with a typical relaxation time constant of ~11 ms. In the time sequence of HRTEM images in FIG. 2a, the gap between the Au electrodes first experienced a constant voltage (20 V) with a 100 nA compliance from 0 s to 5 s, after which the power was turned off. A delay time of ~2 s was observed, during which the measured current was <5 nA and Ag nanoparticles formed in the gap region (indicated by the orange and blue arrows at time 0.1 s), followed by an abrupt current jump to the compliance level as nanoparticles grew further to bridge the gap between the electrodes (indicated by the red arrow in the image taken at 2.5 s). The image taken at 4.6 s shows the cluster reached a diameter of ~4.2 nm.

Up to this point, the behavior of Ag nanoparticles in $SiO_xN_y$ can be interpreted as electrochemical reactions at effectively bipolar electrodes. The power is then turned off at 5.0 s to observe the spontaneous relaxation, which is critical for understanding the dynamics of these diffusive memristor devices. The elongated cluster of nanoparticles that formed the conductive bridge rapidly contracted from a length of 14.8 nm to a circular profile with a diameter of 7.6 nm by 5.7 s, indicating Ostwald ripening. These observations demonstrate that minimizing the interfacial energy between the Ag nanoparticles and the dielectric serves as the driving force for the relaxation dynamics of these diffusive memristors. The material systems exhibiting a substantial relaxation are those with large wetting contact angles, such as $MgO_x$:Ag, $SiO_xN_y$:Ag and $HfO_x$:Ag in FIG. 1b, consistent with the reported pseudo-elasticity of silver nanoparticles and that interfacial energy facilitates filament rupture in volatile switching.

Figures 3A, 3B:
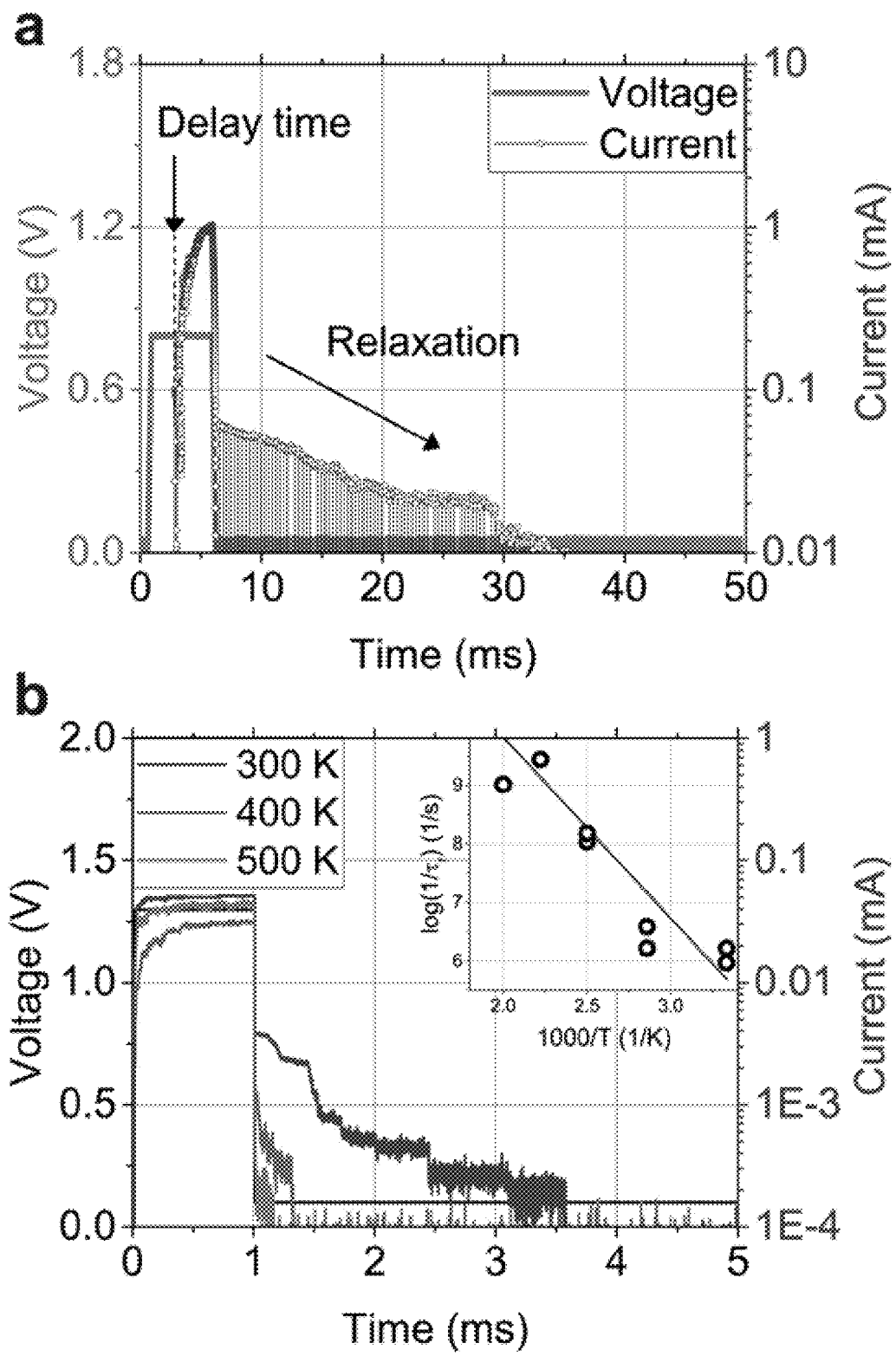
FIGS. 3a-3b illustrate graphical data showing examples of timing characteristics of a diffusive memristor device.

FIGS. 3a and 3b show timing characteristics of the $SiO_xN_y$:Ag based diffusive memristor 120. FIG. 3a graphically depicts delay and relaxation characteristics of the device showing variation of current (blue) with applied voltage (red) pulses. Multiple read voltage pulses (0.05 V, 10 μs) are used to study the device relaxation current after the switching pulse (0.75 V, 5 ms). The device requires a finite delay time to turn ON and has a finite relaxation time before it goes to the high-resistance state after the switching pulse is removed. FIG. 3b is a graph of device relaxation performance showing the variation of current with applied voltage at different temperatures. The relaxation time decreases with increasing temperature. The inset of FIG. 3b shows the Arrhenius plot of the temperature dependence of the relaxation time. Each data point (black circles) is an average over 10 measured relaxation times, and these data points are fitted to the blue line. The activation energy for the material system is calculated to be 0.27 eV.

The dynamical properties of the diffusive memristor device 120 is further studied by applying voltage pulses and measuring resulting currents. Under an applied pulse, the diffusive memristor device 120 exhibits threshold switching to a low resistance state after an incubation period $\tau_d$, as shown in FIG. 3a. This incubation period $\tau_d$ is related to the growth and clustering of silver nanoparticles to eventually form conduction channels. Following channel formation, the current jumps abruptly by several orders of magnitude, and then slowly increases further under bias as the channel thickened. As the voltage pulse ends, the device 120 relaxes back to its original high-resistance state over a characteristic time $\tau_r$. As shown in FIG. 3b, $\tau_r$ decreases as the ambient temperature increases, consistent with a diffusion activation energy of 0.27 eV (inset of FIG. 3b), and the characteristic time was on the same order as the response of bio-synapses, that is, tens of milliseconds. In addition to the temperature, $\tau_d$ and $\tau_r$ were also functions of the voltage pulse parameters, operation history, Ag concentration, host lattice, device geometry, humidity and other factors, which alone or combined can be used to tune the desired dynamics for neuromorphic systems.

To better understand the switching mechanism, simulations are performed using a generalized model similar to the one utilized for non-volatile switching and current noise in $TaO_x$ memristors. This model links electrical, nano-mechanical and thermal degrees of freedom, and is described in greater detail below with respect to the example processes/methods. The model used in the simulations does not include redox reactions, although they can be added to more closely resemble the electrochemical models proposed previously.

Figures 4A, 4B:
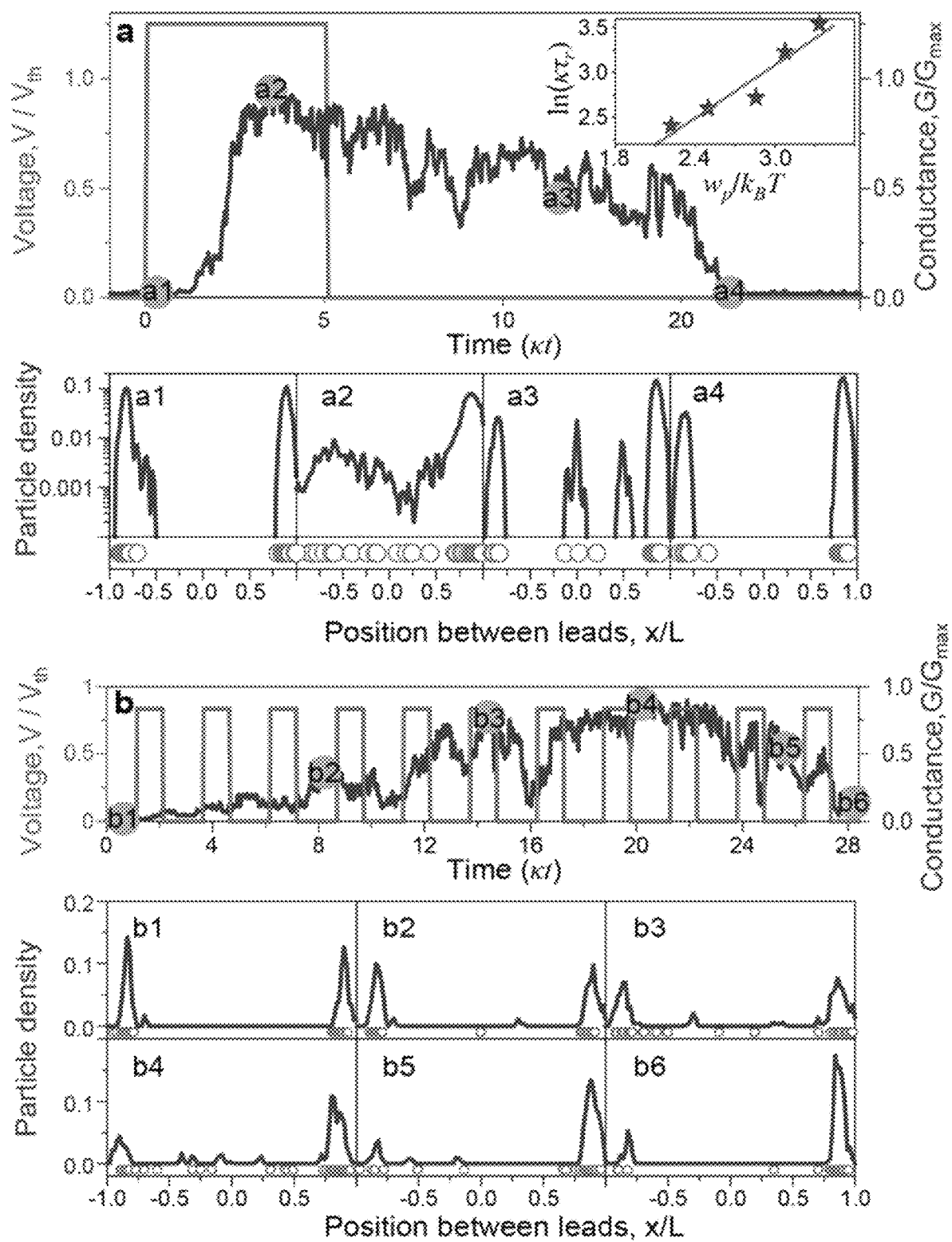
FIGS. 4a-4b illustrate graphical data showing simulated operation of a diffusive memristor device.

FIGS. 4a and 4b illustrate simulated operation of a diffusive memristor device. FIG. 4a graphically depicts that the conductance response (blue curve) induced by a voltage pulse (red curve) shows a delay in the response and a gradual relaxation towards the low conducting state, consistent with the experimental threshold switching property in FIG. 3a. Panels a1-a4 show evolution of metallic nanoparticle density distributions. Blue curves represent particle distributions. Each curve is averaged over temporal interval 0.2/κ around time moments indicated by orange dots (in a) when instantaneous particle snapshots (red dots) are plotted. The inset shows the temperature dependence of the relaxation time τ defined as the time needed for the conductance to drop to value $0.02G_{max}$ after switching the voltage, which agrees with that of FIG. 3b. The red curve is the fitting of $\ln(\kappa\tau_r)$ by the function $A+Bw_p/k_BT$ with A=0.1, B=1.

FIG. 4b graphically depicts the simulated conductance response (blue curve) shows both facilitation and then depression following a sequence of short and frequent pulses (red curve). Panels b1-b6 show evolution of metallic nanoparticle density. Blue curves represent particle distributions; each curve is averaged over temporal interval 0.02/κ, around time moments indicated by orange dots (in b) when instantaneous particle snapshots (red dots) are plotted. The conductance initially increases with number of pulses until a conducting bridge between terminals is formed. The conductance eventually saturates and drops as the number of pulses increases further, which captures an advanced synaptic behavior, that is, PPF followed by PPD. Other simulation parameters are $\lambda/2=R_i=2R_p/3=L/10$, $\times C=85L$. 40 nano-metallic particles are simulated, and the simulation step is $dt=2\times10^{-6}$, resulting in $10^7$ steps during each simulation run; the reasoning of parameter choice and pinning parameters are discussed below with respect to the example processes/methods.

In the performed simulations, two large clusters of metallic nanoparticles are located near each terminal of the device (FIG. 4a1). Referring to FIG. 4a, when a voltage pulse is applied, the local temperature increases due to Joule heating and the potential is tilted by electric forces acting on particles with induced charge, both of which cause larger clusters to break up. As the nanoparticles become more uniformly distributed in the gap, the resistance drops, the current and temperature increase, and a positive feedback results in the formation of a conductive channel (FIG. 4a2). As soon as the power is turned off, the temperature drops, and the nanoparticles start to coalesce (FIG. 4a3), that is, particles slowly diffuse to their minimum energy positions near the device terminals. Eventually, most of the nanoparticles merge into larger clusters to minimize interfacial energy, and the high-resistance state is re-established along with the original particle distribution almost restored (compare FIGS. 4a1 and 4a4), leading to the observed volatility shown in FIG. 2.

Referring to FIG. 4b, when a train of pulses is applied to the diffusive memristor (e.g. diffusive memristor device 120), the model predicts interesting conductance evolution similar to synaptic behavior. First, when the initial voltage pulse is applied, electric field-assisted diffusion pumps some of the Ag particles out of the 'left' cluster and they start to bridge terminals. However, a single short pulse cannot excite enough particles to form a complete conducting path between the two terminals (FIG. 4b2). If a subsequent pulse arrives before particles are reabsorbed, that is, if the time between pulses is shorter than the diffusion relaxation time, more particles are pushed into the gap between terminals resulting in a gradual increase in device conductance, similar to the paired-pulse facilitation (PPF) phenomenon in bio-synapses. The result is that when high-frequency pulses are applied, the device conductance increases with the number of pulses (FIG. 4b) until a conducting bridge is formed (FIGS. 4b1-4b4). Second, as the electric field pumps more and more particles towards one of the device terminals, the number of particles at the other terminal decreases (FIG. 4b4, 4b5, where the distribution peak at the left terminal decreases as more and more pulses arrive). As a result, the number of particles in the gap decreases (FIG. 4b5, 4b6) and the device conductance starts to decay. This results in an inflection of the device conductance due to excessive stimulation, capturing another synaptic behavior, that is, PPF followed by PPD (paired-pulse depression). Third, sequential high-voltage pulses with a long enough interval (low frequency) may form a conducting bridge first, but before the next pulse arrives the bridge breaks and the particles are reabsorbed at the terminals. Due to the electric field, the Ag particles gradually deplete at one terminal and accumulate at the other. Consequently, the conductance of the diffusive memristor device starts to decrease from the initial state without showing facilitation first (PPD).

FIGS. 5a and 5b illustrate the analogy between $Ca^{2+}$ and Ag dynamics, and short-term synaptic plasticity of the diffusive memristor. The left side of FIG. 5a is a schematic diagram that illustrates diffusion of $Ca^{2+}$ from extracellular sources via voltage-sensitive calcium channels (VSCC) and N-methyl-D-aspartate receptors (NMDAR), and the removal of $Ca^{2+}$ via the plasma membrane $Ca^{2+}$-ATPase (PMCA) and the $Na^+/Ca^{2+}$ exchanger (NCE). The right side of FIG. 5a illustrates Ag diffusion into the gap region between Ag nanoclusters with field assistance and clearance of Ag filament from the gap region by the interfacial energy and possibly mechanical stress once the voltage signal is removed, which is a close emulation of $Ca^{2+}$ dynamics. FIG. 5b shows an experimental demonstration of short-term synaptic PPF and PPD behavior with the $SiO_xN_y$:Ag based diffusive memristor. Device current response (blue) to multiple subsequent voltage pulses (e.g., 3 V, 1 ms). The duration between two pulses when the applied voltage is 0 V is denoted as $t_{zero}$. For small $t_{zero}$, the current increases with the number of pulses giving larger conductance (weight) change, demonstrating PPF. Inset shows the percentage change in conductance (weight) for different $t_{zero}$ values. As the $t_{zero}$ increases from 1 ms to 160 ms, the weight change slows down with increasing pulse number and eventually becomes negative.

FIG. 5c shows an experimental demonstration of PPD following PPF in the $SiO_xN_y$:Ag based diffusive memristor. Device current (blue) response to a train of voltage pulses (e.g., 2.8 V, 100 μs) of the same amplitude but different frequencies. The device begins with PPD (depression) following low frequency (196 Hz) stimulation and experiences an increase in current (facilitation) once the stimulation frequency is raised (e.g., 5,000 Hz). The brief facilitation is followed by depressed current under identical stimulation frequency (e.g., 5,000 Hz) but excessive pulse number, as a result of the gradual depletion of silver at one electrode and accumulation at the other. The current relaxes to its initial value with subsequent low-frequency stimulation (e.g., 196 Hz), implying potential for autonomic computing.

The simulations for Ag in the dielectric agree well with the experimental HRTEM observations. In addition, significant similarities exist between the Ag dynamics and that of synaptic $Ca^{2+}$ (in biological structures), not only in the diffusion mechanism but also in their dynamical balance of concentration and regulating roles in their respective systems. $Ca^{2+}$ dynamics is responsible for initiating both short- and long-term plasticity of synapses, forming the basis of memory and learning. In chemical synapses, the dynamical balance of the $Ca^{2+}$ concentration is shaped by both influx via voltage-sensitive calcium channels and N-methyl-D-aspartate receptors, and extrusion via the plasma membrane $Ca^{2+}$-ATPase and the $Na^+/Ca^{2+}$ exchanger that restores $[Ca^{2+}]_i$ to the basal concentration. The $Ca^{2+}$ dynamics naturally leads to short-term plasticity in which residual elevation of presynaptic $[Ca^{2+}]$, directly correlates to the enhancement of synaptic transmission. In biological structures, the calcium inside the postsynaptic membrane also plays important roles in regulating long-term potentiation and depression where $Ca^{2+}$ accumulation is necessary to regulate enzymes, that is, $Ca^{2+}$/calmodulin-dependent protein kinase II (CaMKII), calcineurin and protein phosphatase 1, which in turn triggers rapid and persistent modification of synaptic strengths by changing the number and/or conductance of α-amino-3-hydroxy-5-methyl-4-isoxazole-propionic acid receptors. When compared with the diffusive memristor 120, the Ag diffusion into the gap region between Ag nanoclusters with field assistance (FIGS. 2a and 4a-4b), resembles the influx processes of $Ca^{2+}$. The clearance of bridging Ag nanoparticles from the gap region by interfacial energy and possibly mechanical stress when electrical stimulus is removed replicates the extrusion processes of $Ca^{2+}$. Thus, as FIG. 5a demonstrates, the Ag dynamics of the diffusive memristor 120 is a functional emulation of bio-synapses. An expected characteristic of diffusive memristors is short-term plasticity, where application of paired pulses to synapses can induce an increase or decrease in postsynaptic responses, depending on the frequency of applied pulses. As shown in FIG. 5b, when the time interval between pulses ($t_{zero}$) is short (high frequency), the device conductance increases (PPF) from its initial conductance (steady state of the diffusive memristor) as the number of pulses increases. In contrast, a long $t_{zero}$ (low frequency) leads to a reduced rate of increment or even a decrease in conductance (PPD) from the same initial conductance (inset of FIG. 5b. Moreover, it has also been shown in bio-synapses that prolonged or excessive stimulations with high frequency (short $t_{zero}$) pulses will eventually lead to an inflection from facilitation to depression, an effect solely induced by an increased number of stimulation pulses at the same frequency. This important feature of bio-synapses, which has not been clearly demonstrated previously on two-terminal devices, is predicted in FIG. 4b and observed experimentally in FIG. 5c. The device in its steady state shows PPD following low frequency (196 Hz) stimulation and experiences an increase in current (facilitation) once the stimulation frequency is raised (5,000 Hz). The facilitation turns into depression (current decrease) with more pulses having identical frequency (5,000 Hz) due to the gradual depletion of silver at one electrode and accumulation at the other. The depression continues with the low frequency (196 Hz) pulses, which eventually brings the device back to a state close to its initial steady state, implying the potential for autonomic computing.

Figures 6A, 6B, 6C, 6D:
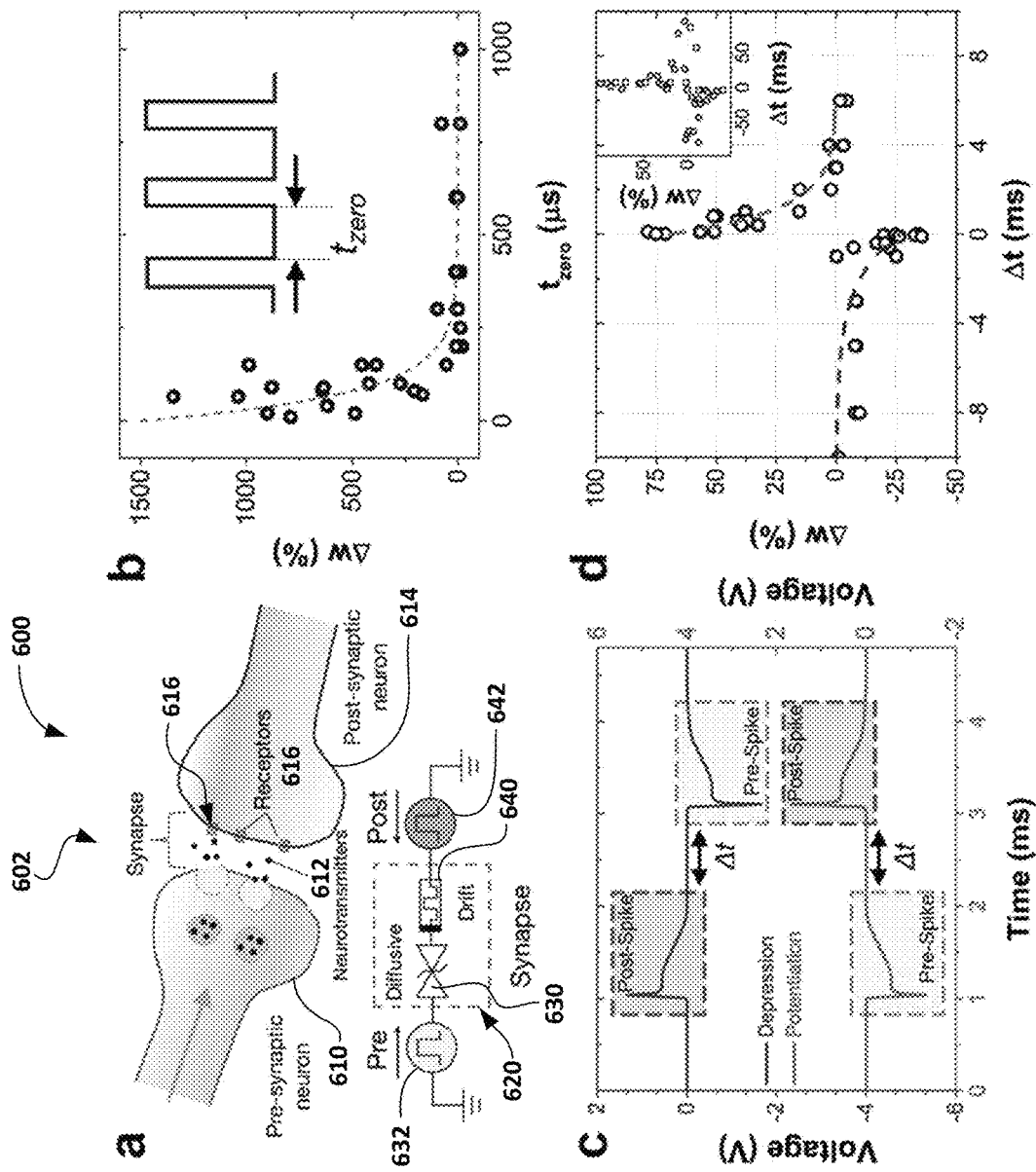
FIGS. 6a-6d illustrate bio-realistic long-term plasticity features of a diffusive memristor implemented as an electronic synapse emulation device.

FIGS. 6a to 6d illustrate bio-realistic long-term plasticity features that can be achieved by the diffusive memristor 120 when implemented as an electronic synapse emulation device. FIG. 6a illustrates a biological synapse 600 that includes a synaptic junction 602 between a pre-synaptic neuron 610 and a post-synaptic neuron 614 having multiple receptors 616. Neurotransmitters 612 are shown in the synaptic junction 602.

FIG. 6a also illustrates a circuit diagram for the electrical implementation of an example of an electronic synapse emulation device 620 (also referred to as an electronic synapse) formed by a $SiO_xN_y$:Ag based diffusive memristor 630 connected in series with the $TaO_x$-based drift memristor 640, and between a pre pulsed voltage source 632 and a post pulsed voltage source 642, which operate analogous to neurons that send voltage spikes to a biological synaptic junction, such as synaptic junction 602.

FIG. 6b is a graph illustrating spike-rate-dependent plasticity (SRDP) showing the change in the conductance (weight) of the drift memristor 640 in the electronic synapse 620 with the change in the duration $t_{zero}$ between the applied pulses. For long $t_{zero}$, the change in the conductance of the diffusive memristor 630 is lower (see FIG. 5b), resulting in a lower weight change of the drift memristor 640. As the $t_{zero}$ decreases, the weight change increases. The dashed red line represents a fit of the average conductance change with change in $t_{zero}$.

FIG. 6c is a schematic of the pulses applied to the electronic synapse emulation device 620 for STDP demonstration. The long low-voltage pulse in each spike turns the diffusive memristor 630 ON, and the short high-voltage pulse switches the drift memristor 640. When the post-spike precedes the pre-spike, the device is reset (depressed), and when the pre-spike precedes the post-spike, the device is set (potentiated). The timing (Δt) between the two spikes determines the voltage drop across the drift memristor 640.

FIG. 6d is a graph illustrating a plot of the conductance (weight) change of the drift memristor 640 with variation in Δt showing the STDP response of the electronic synapse 620. This response of the electronic synapse 620 is characteristic of the timing-dependent response of biological synapses. The inset of FIG. 6d shows the STDP of a typical chemical synapse.

The above PPF and PPD demonstrations are realized with diffusive memristors alone, resembling short-term plasticity in synapses because any conductance change from the OFF state of diffusive memristors will vanish over time. When combined with a non-volatile element, e.g., a drift-type memristor, long-term plasticity following the SRDP and STDP learning rules can be realized. To further demonstrate these features, in some implementations, a combined circuit element using a diffusive memristor 630 in series with a Pt/$TaO_x$/Ta/Pt drift memristor 640 is used. In such cases, the electronic synapse emulation device 620 is connected to pulsed voltage sources 632, 642 similar to a synapse 600, 602 between a pre-synaptic neuron 610 and post-synaptic neuron 614 (FIG. 6a). The SRDP demonstration is illustrated in FIG. 6b, where the drift memristor weight (conductance) change is a function of the frequency of the applied pulses. Similar to FIG. 5b, a shorter $t_{zero}$ results in a greater increase in the conductance of the diffusive memristor 630 and thus a larger voltage drop across the drift memristor 640, which thereby switched due to the voltage divider effect. A longer $t_{zero}$ results in a smaller increase in the diffusive memristor conductance and thus a smaller voltage drop across the drift memristor 640, leading to a smaller or non-detectable resistance change in the drift memristor 640.

To demonstrate the STDP learning rule with non-overlapping spikes, pre- and postsynaptic spikes (FIG. 6c) are applied to the electronic synapse emulation device 620. The two spikes are separated by a time difference Δt, which determines how much conductance change was programmed in the drift memristor 640. Each spike includes two parts, a high-voltage short pulse and a low-voltage long pulse. The pre-spike and post-spike are equal in magnitude but opposite in voltage polarity (FIG. 6c). In the electronic synapse emulation device 620, the resistance of the diffusive memristor 630 in its OFF state is much larger than that of the drift memristor 640, while the resistance of its ON state is much smaller than that of the drift memristor 640. As the diffusive memristor 630 has a finite delay time, the short high-voltage pulse will not turn it ON. In contrast, the long voltage pulse with a lower amplitude will turn ON the diffusive memristor 630. The drift memristor 640 is not switched by the first spike, because the majority of the voltage drop occurs across the diffusive memristor 630 and turns it ON first. After the spike ends, the resistance of the diffusive memristor 630 gradually increases from its ON state over time, regulated by the diffusive dynamics. The second spike occurs at a time Δt from the end of the first spike, and it may or may not switch the drift memristor 640 depending on how much voltage drop occurs across the drift memristor 640, which is determined by the conductance of the diffusive memristor 630 at that moment, a function of Δt. A smaller Δt corresponds to a smaller diffusive memristor resistance and results in a greater resistance change in the drift memristor 640 and vice versa (FIG. 6d). If the pre-spike appears before the post-spike, the drift memristor conductance increases (potentiation). If the pre-spike follows the post-spike, depression occurs. As the dynamics of the diffusive memristor 630 provides an intrinsic timing mechanism for the combined element, the SRDP and STDP do not require complex pulse engineering or spike overlapping. This substantially reduces the complexity of both circuit and algorithm design and enables low-energy operations. In addition, depending on the application, other non-volatile memristors (e.g. low/high retention, analog/digital) may be substituted for the drift memristor 640 and used along with the diffusive memristor 630, allowing a significantly broader choice of materials rather than relying on the properties of the drift memristor when used alone. For example, a Pt/$HfO_x$/TiN drift memristor can be used in some cases.

The above description with respect to FIGS. 6a-6d disclose a new class of memristors as synaptic emulators (620) that function primarily on the basis of diffusion (rather than drift) dynamics. The microscopic nature of both the threshold switching and relaxation of the diffusive memristor, such as diffusive memristor 120, is revealed by in situ HRTEM and explained by nanoparticle dynamics simulation. The Ag dynamics of the diffusive memristors functionally resemble the synaptic $Ca^2$ behavior in chemical synapses and lead to a direct and natural emulation of multiple synaptic functions for both short-term and long-term plasticity, such as PPF, PPD, PPD following PPF, SRDP and STDP. In addition to providing a synapse emulator (620), the diffusive memristor can also serve as a selector with a large transient nonlinearity that is useful for the operation of a large crossbar array, such as a neural network. Accordingly, diffusive memristors can be used for neuromorphic computing directed towards synaptic emulation.

The following sections describe examples of processes or methods for fabricating diffusive memristor devices, e.g., the diffusive memristor device 120, and corresponding experimental results. In some implementations, the diffusive memristor devices, such as diffusive memristor 120, were grown on p-type (100) silicon (Si) wafer with 100 nm thermal oxide. In such implementations, the bottom electrodes 130 were patterned by photolithography followed by evaporation and lift off of a ~20 nm thick platinum (Pt) or gold (Au) layer. The ~15 nm thick doped dielectric 140 was deposited at room temperature by reactively co-sputtering MgO or HfO$_2$ and Ag in an ambient of mixed argon (Ar) and oxygen (O$_2$), or co-sputtering Si and Ag (142) in Ar, N$_2$, and O$_2$. The ~30 nm platinum (Pt) or gold (Au) layer top electrodes 150 were subsequently patterned by photolithography followed by evaporation and liftoff processes. Electrical contact pads of the bottom electrodes 130 were first patterned by photolithography and then subjected to reactive ion etching with mixed CHF$_3$ and O$_2$ gases.

In the implementations described above, drift memristor devices used the same substrates and bottom electrodes as the diffusive memristor devices. The switching layer was grown by sputtering Ta$_2$O$_5$ (HfO$_2$) for a thickness of ~10(5) nm in Ar gas followed by photolithography. Top electrodes were deposited by evaporating Ta(5 nm)/Pt(20 nm) (sputtering TiN(50 nm)/Pd(30 nm)) and liftoff.

For the implementations described above, electrical measurements were performed in some cases with a Keysight B1500A semiconductor device analyser using two of its modules. DC measurements were carried out using the source and measure units (B1517A) and the B1530A waveform generator/fast measurement unit (WGFMU) was used to perform the pulse measurements. Using a two-probe (W tips) configuration, DC and pulse voltages were applied between the top and bottom electrodes of the device and measured current through one of the measurement units. The same units were used to perform measurements at different temperatures on the Variable Temperature Micro Probe System (MMR technologies, K2000 Digital Temperature Controller) in ambient atmosphere. The SRDP and the STDP experiments were performed with the diffusive memristor 120, 630 in series with a Pt/TaO$_x$/Ta/Pt drift memristor 640. The B1530A WGFMU was used for applying the pre- and spike-postsynaptic voltage spikes. The conductance of the drift memristor was read using a small DC voltage between each programming operation to determine the change in its weight. For each data point of the SRDP measurement, the drift memristor was first initialized to its high resistance state, and then 15 voltage pulses were applied across the combined series memristors 620 with the same pulse amplitude (2.5V), duration (40 μs) and a particular t$_{zero}$ value, and finally read the drift memristor to determine the change in its state induced by the train of 15 pulses.

In some implementations, planar samples for TEM were prepared as follows.

A specimen for in situ HRTEM was grown on an Aduro E-chip with pre-built Au connections (Model E-AELOO-LN, Protochip). Au electrodes were patterned by electron beam lithography followed by evaporation and liftoff of a ~20 nm thick Au layer. The doped dielectric layer of SiO$_x$N$_y$:Ag was deposited by reactively co-sputtering of both Si and Ag targets in an ambient of Ar, N$_2$, and O$_2$ at room temperature with a thickness of ~30 nm.

The in situ HRTEM was performed at Brookhaven National Laboratory with an FEI Titan 80-300 operating at 300 keV. The sample was grown on the Aduro E-chip, which was mounted on a corresponding Aduro TEM holder for FEI (Protochip). Current was monitored in real-time on a Keithley 2602B System Source Meter, which exerted electrical bias.

The following sections describe dynamical simulations for the diffusive memristor. The diffusive memristor model links electrical, nano-mechanical and heat degrees of freedom: (a) the growth, shape change and decay of clusters of nanoparticles identified by their positions x$_i$ inside a device (i is the nanoparticle label), (b) the electric current through the device governed by a sequence of tunnelling resistances between nanoparticles, and (c) the local temperature controlling the nanoparticle diffusion, determined by Joule heating and the thermal conductivity of the memristor.

The mathematical definition for a generic memristor has two components, the quasi-static conduction equation relating voltage v and current i, or Ohm's law for the element $$v = iR(x), \quad (1)$$

where R is the state-dependent resistance and x represents one or more state variables that define the physical properties of the memristor, and the dynamical equation(s) that define the evolution of the state variables with time in the presence of a current and affected by local temperature T:

$$\frac{dx}{dt} = f(x; i, T), \quad (2)$$

For the state-dependent resistance, sequential electron tunnelling is assumed: first from the input terminal to the nearest metallic nanoparticle, and then from this nanoparticle to the next one and so on with the last tunnelling event to the output terminal. The total resistance of the memristor is the sum of tunnelling resistances between N−1 adjacent nanoparticles/islands:

$$R_M = \sum_0^{N-1} R_t \exp[(x_{i+1} - x_i)/\lambda] \quad (3)$$

with λ the effective tunnelling length, R$_t$ the tunneling resistance amplitude (assumed the same for all islands), x$_0$ and x$_N$ the spatial coordinates of the input and output terminals, respectively, and the island positions are ordered as x$_0$<x$_1$<x$_2$<...<x$_{N-1}$<x$_N$. The minimum resistance can be estimated as R$_{min}$=min R$_M$=NR$_t$exp[2L/Nλ]. L is the half size of the device.

To describe the nanoparticle diffusion, and thus the memristor dynamics, an over-damped Langevin equation was employed for each mobile metallic nanoparticle trapped by a potential U and subject to a random force ξ$_i$, the magnitude of which is determined by the device local temperature T, $$\eta \frac{dx_i}{dt} = -\frac{\partial U(x_i)}{\partial x_i} + \alpha \frac{V(t)}{L} + \sqrt{2\eta k_B T} \, \xi_i \quad (4)$$

In the equation (4) the friction term (left hand side), proportional to the particle velocity and viscosity η, is balanced by all other forces acting on nanoparticles. The first term on the right hand side of equation (4) forces the nanoparticle to approach the minimum potential energy with a speed that is proportional to minus the local gradient of the potential energy. The drift term αV(t)/L represents a bias in the electric filed E=V(t)/L affecting nanoparticle with induced charge α when the voltage, V(t) is on. The electrical bias together with diffusion is responsible for switching to a high conducting state and depletion of nanoparticles at one of the device terminals. The random force, $\sqrt{2\eta k_B T}\xi_i$, which is driven by the instantaneous temperature, describes diffusion of the nanoparticles that occurs both when voltage is on and when the system relaxes with no bias toward the potential minimum after the power to the device is off and the local temperature cools. In other words, since T is nonzero, there will always be some diffusion of the nanoparticles modelled by adding random thermal fluctuations $\xi_i$, which are $\delta$-correlated white noise characterized by $<\xi>=0$ and $<\xi(0)\xi(t)>=\delta(t)$.

The potential $U=U_I+U_p$ has two energy scales—the interfacial energy $U_I$ responsible for formation of large metallic clusters near the device terminals and a weaker nanoparticle-pinning energy $U_p$ with many smaller wells between the electrodes. Pinning can occur through interactions of the nanoparticles with impurities, the substrate and/or the ionic lattice. For the simulations, $$U_I = -w_I\left[\exp\left(-\frac{(x_i+x_c)^2}{R_I^2}\right) + \exp\left(-\frac{(x_i-x_c)^2}{R_I^2}\right)\right] \text{ and}$$

$$U_p = \frac{w_p}{2}\sin\left(2\pi\frac{x}{R_p}\right),$$

were used, with the interfacial energy barrier $w_I$ and the amplitude $w_p$ of the pinning potential; $x_c$ and $-x_c$ are locations of large clusters formed due to interfacial energy. The particular shape of neither the interfacial potential nor the pinning energy profile is essential; the only property that matters is that the potential U has two different energy scales and the weaker pinning potential has many wells (for example it can be random with fluctuating $w_p$ and $R_p$). At high enough temperature during a voltage pulse, the increased diffusion assisted by the electrical force breaks up the large nanoparticle clusters and populates the pinning sites. At lower temperatures after the power is off and the potential bias disappears, the nanoparticles re-aggregate to form clusters at the electrodes. Moreover, a qualitatively similar result (although requiring considerably more computational resources) has been obtained when the interfacial energy is modelled as an interaction between particles.

The temperature dynamics are determined by Newton's law of cooling:

$$\frac{dT}{dt} = C_T Q - \kappa(T - T_0) \quad (5)$$

with the Joule heating power $Q=V^2/R_M$ increasing the temperature of the system and thermal conductivity acting as a damping factor by removing energy from the system. Here, $\kappa$ and $C_T$ are the heat transfer coefficient and heat capacitance respectively, while the background temperature is $\tau_0$. Equations (4) and (5) are sufficient to describe the memristor dynamics subject to the current through the device, which is controlled by the electric circuit in which it is embedded. Thus, the model described above enables the simulation of a complex system comprising both volatile and non-volatile memristors.

There are two time scales in the model, the diffusion time scale and the characteristic scale of temperature relaxation. The first one depends on temperature, potential profile, and electric drift; thus, this time scale changes depending on voltage pulse intensity and temperature. Accordingly, all time in the simulations is measured in units of the temperature relaxation time $1\kappa$. As can be seen from FIG. 4, the relaxation occurs on time scales of the order 10-20 $1/\kappa$ thus, the simulated system is clearly governed by diffusion rather than the temperature relaxation. There are two conductance states with low and high conductance. The conductance $1/R_{min}$ in the high conductance state was used as a normalization factor. The normalization enabled the simulated conductance to be plotted as a percentage of its maximum conductance after each applied pulse, for instance, FIG. 4b shows that the conductance reached 25% of the maximum after 4 pulses and about 75% after 7 pulses. To provide a better link to the experimental data, the voltages to the threshold voltage $V_{th}$ were normalized, which was assumed to be the voltage where the conductance reached 10% of its maximum value. These quantities can be easily obtained from both simulations (averaged over 30 realizations) and experimental I-V hysteresis loops, thus directly linking the units in the simulations and the experiments. For the sake of consistency, all voltages to $V_{th}$ were normalized at the highest simulated temperature, $$\frac{k_B T}{w_p} = 0.45.$$

The temperature $$\frac{k_B T}{w_p}$$

in the simulations was varied from 0.3 to 0.45 (i.e, the same relative range as in FIG. 3b). In this range, the characteristic single-hopping time scale $e^{w_p/k_B T}$ changed from about $2/\kappa$ to $6/\kappa$ and the diffusion relaxation time (estimated as a characteristic jump time multiplied by the number of jumps to reach the interfacial minimum near the device terminal) was about $20/\kappa$ to $60/\kappa$. The ratio of interfacial and pinning potentials $w_I/w_p$ was assumed to be 4.5 in the simulations to ensure that the interfacial potential was strong enough to re-trap the Ag nanoparticles after the voltage was switched off and the thermal fluctuations were too weak to destroy the large clusters near the terminals in the absence of excess heating. Conversely, the electric force ($\alpha V_{th} R_p/w_I$=0.3 in the simulations) was used to suppress the interfacial barrier $k_B w_I/T$ to about 3.6, which enabled the enhanced thermal fluctuations induced by Joule heating to activate the positive thermal feedback. The stronger fluctuations support larger Joule heating and vice versa, breaking up the large Ag clusters to form a string of smaller nanoparticles and thus a conductive path between the terminals, as observed experimentally in the HRTEM studies. Some model parameters were also linked with experimentally measurable ones, e.g., $C_T \approx \kappa w_p R_I/V_{th}^2 k_B$, $\eta \approx w_p/\kappa L^2$, and $\alpha \approx \eta \kappa L^2/V_{th}$.

Although a few implementations have been described in detail above, other modifications are possible. In addition, other components may be added to, or removed from, the described diffusive memristor device. Accordingly, other implementations are within the scope of the following claims.

What is claimed is:

1. A diffusive memristor device, comprising:
   a bottom electrode;
   a top electrode formed opposite the bottom electrode; and
   a dielectric layer disposed between the top electrode and the bottom electrode, the dielectric layer comprising silver doped silicon oxynitride ($SiO_xN_y$:Ag).

2. The diffusive memristor device of claim 1, wherein the bottom electrode comprises one of a platinum layer or a gold layer.

3. The diffusive memristor device of claim 1, wherein the top electrode comprises one of a platinum layer or a gold layer.

4. The diffusive memristor device of claim 1, wherein the dielectric layer comprises silver nanoparticles disposed within the silicon oxynitride.

5. The diffusive memristor device of claim 1, wherein the diffusive memristor device is formed on a substrate.

6. The diffusive memristor device of claim 5, wherein the substrate includes a silicon oxide layer.

7. The diffusive memristor device of claim 5, wherein a titanium layer is deposited on a surface of the substrate, the titanium layer generating an adhesion surface for the bottom electrode.

8. A synapse emulation device, comprising:
a diffusive memristor device that includes a switching layer comprising a dielectric insulating layer and nanoclusters of a diffusive metal dispersed within the dielectric insulating layer;
a drift memristor device connected in series with the diffusive memristor device;
a first voltage pulse generator connected to the diffusive memristor device; and
a second voltage pulse generator connected to the drift memristor device,
wherein the diffusive memristor device exhibits plasticity upon application of a signal from one of the first voltage pulse generator or the second voltage pulse generator to the synapse emulation device.

9. The synapse emulation device of claim 8, wherein a long low-voltage pulse turns the diffusive memristor device on.

10. The synapse emulation device of claim 8, wherein a short high-voltage pulse switches on the drift memristor device.

11. The synapse emulation device of claim 8, wherein the diffusive memristor device is a silver doped silicon oxynitride ($SiO_xN_y$:Ag) based diffusive memristor.

12. The synapse emulation device of claim 8, wherein the drift memristor device is a tantalum oxide ($TaO_x$) based drift memristor.

13. The synapse emulation device of claim 8, wherein the diffusive memristor device comprises:
a bottom electrode; and
a top electrode formed opposite the bottom electrode,
wherein the switching layer is disposed between the top electrode and the bottom electrode, and the dielectric insulating layer comprises silver doped silicon oxynitride ($SiO_xN_y$:Ag).

14. The synapse emulation device of claim 13, wherein the bottom electrode of the diffusive memristor device comprises one of a platinum layer or a gold layer.

15. The synapse emulation device of claim 13, wherein the top electrode of the diffusive memristor device comprises one of a platinum layer or a gold layer.

16. The synapse emulation device of claim 13, wherein the nanoclusters of the diffusive metal dispersed within the dielectric insulating layer comprise silver nanoparticles disposed within the silicon oxynitride.

17. The synapse emulation device of claim 13, wherein the diffusive memristor device is formed on a substrate.

18. The synapse emulation device of claim 17, wherein the substrate includes a silicon oxide layer.

19. The synapse emulation device of claim 17, wherein a titanium layer is deposited on a surface of the substrate, the titanium layer generating an adhesion surface for the bottom electrode.

20. A diffusive memristor device, comprising:
a bottom metal electrode;
a top metal electrode formed opposite the bottom metal electrode; and
a dielectric layer disposed between the top metal electrode and the bottom metal electrode, the dielectric layer comprising a combination of (i) a diffusive metal and (ii) one of an oxide, an oxynitride, or a nitride,
wherein nanoclusters of the diffusive metal are formed within the dielectric layer.

21. The diffusive memristor device of claim 20, wherein the diffusive metal includes one of silver (Ag) or copper (Cu).

22. The diffusive memristor device of claim 20, wherein the oxide includes silicon oxide ($SiO_2$), and wherein the oxynitride includes silicon oxynitride ($SiN_yO_x$).

* * * * *